(12) United States Patent
Gregory et al.

(10) Patent No.: US 6,859,471 B2
(45) Date of Patent: Feb. 22, 2005

(54) METHOD AND SYSTEM FOR PROVIDING THERMAL CONTROL OF SUPERLUMINESCENT DIODES

(75) Inventors: Peter Gregory, North Attleboro, MA (US); Alfred Healy, Bedford, MA (US)

(73) Assignee: Fibersense Technology Corporation, Canton, MA (US)

( * ) Notice: Subject to any disclaimer, the term of this patent is extended or adjusted under 35 U.S.C. 154(b) by 0 days.

(21) Appl. No.: 10/283,672

(22) Filed: Oct. 30, 2002

(65) Prior Publication Data

US 2004/0086008 A1 May 6, 2004

(51) Int. Cl.$^7$ ................................................. H01S 3/04
(52) U.S. Cl. ............................................ 372/34; 32/46
(58) Field of Search ............................. 372/32, 34, 46

(56) References Cited

U.S. PATENT DOCUMENTS 5,438,579 A * 8/1995 Eda et al. .................... 372/34

* cited by examiner

*Primary Examiner*—Minsun Oh Harvey
*Assistant Examiner*—Cornelius H Jackson

(57) ABSTRACT

A method of stabilizing output characteristics of an SLD device with respect to ambient temperature is disclosed. The SLD device includes a cooling module for cooling an SLD chip, and a sensor for providing a set point signal corresponding to a set point temperature. The cooling module and the sensor, together with control electronics, form a feedback loop for maintaining the set point temperature within a predetermined range. The method comprises determining a variation of the output characteristics as a function of ambient temperature, and determining a variation of the set point signal as a function of ambient temperature, wherein the variation of the set point signal corresponds to the variation of the output characteristics. The method also includes modifying the feedback loop so as to offset the variation of the set point signal, and thereby stabilize the variation of the output characteristics as a function of ambient temperature.

25 Claims, 5 Drawing Sheets

METHOD AND SYSTEM FOR PROVIDING THERMAL CONTROL OF SUPERLUMINESCENT DIODES

CROSS-REFERENCE TO RELATED APPLICATIONS

Not Applicable

STATEMENT REGARDING FEDERALLY SPONSORED RESEARCH

Not Applicable

REFERENCE TO MICROFICHE APPENDIX

Not Applicable

BACKGROUND OF THE INVENTION

The present invention relates to high intensity light sources in Fiber Optic Gyroscopes (referred to herein as FOGs), and more particularly, to methods of and systems for stabilizing, over a wide temperature range, the output characteristics of a superluminescent diode.

FOG measurement error can generally be divided into the categories of bias error and scaling error. All gyroscopes have a certain degree of measurement error that is present upon initialization, referred to as bias error. The second category of error, referred to herein as scaling error (or alternatively scale factor error), accumulates over the angle through which a gyroscope is being rotated. Scaling error is the difference between the actual angle of rotation the FOG experiences and the angle of rotation indicated at the FOG output. A FOG indicating that it had turned ninety degrees when it had, in fact, turned ninety-two degrees, is an example of scaling error. The amount of scaling error may be affected by various environmental factors, so that a fixed compensation value is generally not sufficient to completely correct the FOG output.

FOGs typically use superluminescent diodes (referred to herein as SLDs) as light sources. The performance of a FOG is dependent upon the wavelength of the light source, since the scaling error associated with the FOG is directly proportional to the wavelength of the light from the SLD. The wavelength of the SLD varies linearly with its operating temperature, so it is necessary to temperature-stabilize the SLD with a thermoelectric cooling module (TEC) in order to limit scale factor variations over a wide range of FOG operating temperatures.

Commercially available (prior art) SLD devices 10 typically include a TEC component 12 mounted internally within the SLD device package 14, as shown in block diagram form in FIG. 1. The SLD chip 16, the light emitting element, is mounted directly to the surface of the TEC 12 along with a thermistor 18. The thermistor leads 20 are brought out from the package to permit operation with external temperature control electronics 22.

The wavelength (and consequently scale factor) sensitivity of the SLD is typically on the order of 400 parts per million (ppm) per degree Celcius (° C.). In order to limit scale factor variations to within an exemplary target goal of 100 ppm, it is necessary to control the temperature of the SLD to within at least 0.25° C. over the operating temperature range. A typical operating temperature range is from −54° C. to 71° C. The temperature control electronics combined with an ideal TEC would be able to provide the control functions necessary for this level of stability. However, limitations of the construction and performance of commercially available TEC modules preclude scale factor stability better than 100 ppm.

SUMMARY OF THE INVENTION

In one aspect, a method of stabilizing one or more output characteristics of an SLD device with respect to ambient temperature is disclosed. The SLD device includes (i) a thermoelectric cooling module (TEC) for cooling an SLD chip, and (ii) a temperature sensor for providing a set point signal corresponding to a set point temperature. The TEC and the temperature sensor, together with temperature control electronics, form a temperature control feedback loop for maintaining the set point temperature within a predetermined temperature range. The method comprises determining a variation of the one or more output characteristics as a function of ambient temperature. The method further includes determining a variation of the set point signal as a function of ambient temperature, wherein the variation of the set point signal corresponds to the variation of the one or more output characteristics. The method also includes modifying the temperature control feedback loop so as to offset the variation of the set point signal, and thereby stabilize the variation of the one or more output characteristics as a function of ambient temperature.

Another embodiment further includes determining a variation of an optical power output of the SLD device with respect to ambient temperature.

Another embodiment further includes determining a variation of a thermistor set point resistance, wherein the temperature sensor includes a thermistor and the set point signal includes a set point resistance.

Another embodiment further includes sensing a case temperature of a case enclosing the SLD device, and using the case temperature as ambient temperature to modify the temperature control feedback loop so as to offset the variation of the set point signal. Doing so stabilizes the variation of the one or more output characteristics as a function of ambient temperature.

Another embodiment further includes disposing a thermistor substantially adjacent to the case enclosing the SLD device, and using a resistance associated with the thermistor in the temperature control feedback loop, so as to offset the variation of the set point signal.

Another embodiment further includes attaching the thermistor to the case enclosing the SLD device.

Another embodiment further includes electrically coupling the thermistor to a bridge circuit within the temperature control electronics so as to offset the variation of the set point signal.

Another embodiment further includes combining support circuitry with the thermistor in the bridge circuit such that the thermistor combined with the support circuitry exhibits a desired resistance profile.

Another embodiment further includes determining ambient temperature by sensing a case temperature of a case enclosing the SLD device.

Another embodiment further includes modifying the temperature control feedback loop with a processor executing code that algorithmically produces a compensated TEC control signal as a function of the set point signal and the ambient temperature.

In another aspect, a system for stabilizing one or more output characteristics of an SLD device with respect to ambient temperature is disclosed. The SLD device includes (i) a thermoelectric cooling module (TEC) for cooling an SLD chip, and (ii) a set point temperature sensor for providing a set point signal corresponding to a set point temperature. The TEC and the temperature sensor, together with temperature control electronics, form a temperature control feedback loop for maintaining the set point temperature within a predetermined temperature range. The system comprises an ambient temperature sensor disposed substantially adjacent to a case enclosing the SLD device, for providing a sensing signal representative of ambient temperature. The system further comprises offsetting circuitry, associated with the temperature control feedback loop, for receiving the sensing signal representative of ambient temperature, for offsetting a variation of the set point signal as a function of ambient temperature, and for providing a compensated TEC control signal to the TEC.

In another embodiment, the set point temperature sensor includes a thermistor, and the set point signal includes a set point resistance.

In another embodiment, the ambient temperature sensor includes a thermistor for sensing a case temperature of the case enclosing the SLD device.

In another embodiment, the thermistor physically contacts the case enclosing the SLD device.

In another embodiment, the thermistor is attached to the case enclosing the SLD device.

In another embodiment, the offsetting circuitry includes conductors for electrically coupling the thermistor to a bridge circuit within the temperature control electronics.

In another embodiment, the offsetting circuitry is further combined with support circuitry such that the thermistor combined with the offsetting circuitry and the support circuitry exhibits a desired resistance profile.

In another embodiment, the offsetting circuitry includes a processor executing code that algorithmically produces a compensated TEC control signal as a function of the set point signal and the ambient temperature.

In another embodiment, the offsetting circuitry includes an ASIC device for receiving the set point signal and the sensing signal representative of ambient temperature and producing a compensated TEC control signal therefrom.

In another aspect, a system for stabilizing one or more output characteristics of an SLD device with respect to ambient temperature is disclosed. The SLD device includes (i) a thermoelectric cooling module (TEC) for cooling an SLD chip, and (ii) a set point temperature sensor for providing a set point signal corresponding to a set point temperature. The TEC and the temperature sensor, together with temperature control electronics, form a temperature control feedback loop for maintaining the set point temperature within a predetermined temperature range. The system comprises means for sensing ambient temperature disposed substantially adjacent to a case enclosing the SLD device, for providing a sensing signal representative of ambient temperature. The system further comprises means for receiving the sensing signal representative of ambient temperature and for offsetting a variation of the set point signal as a function of ambient temperature.

BRIEF DESCRIPTION OF DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENTS

Figure 1:
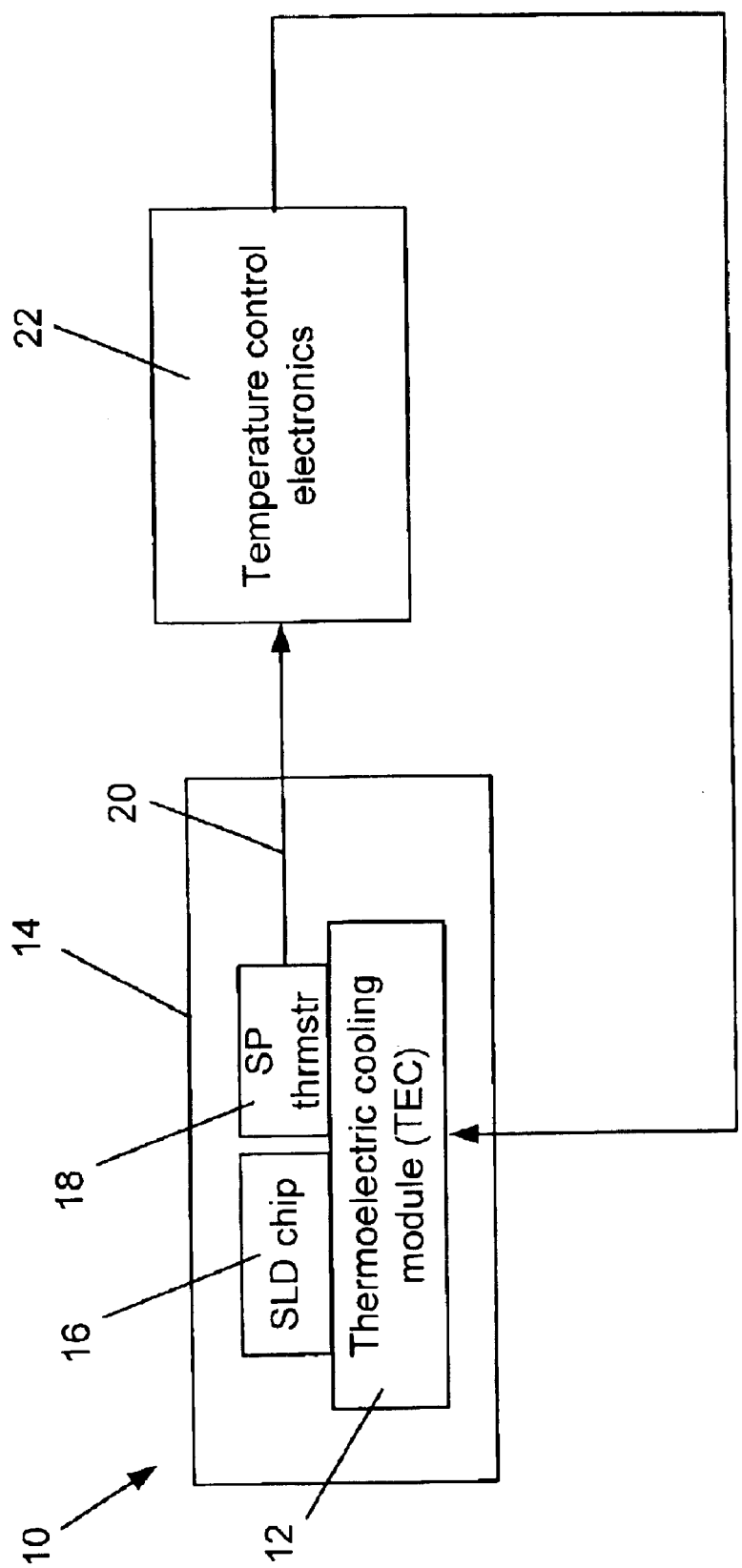
FIG. 1 shows in block diagram form a typical prior art SLD device.
Figure 2:
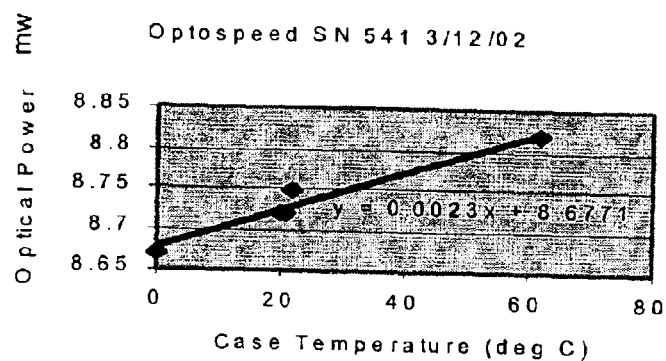
FIG. 2 shows the optical power measured from a prior art SLD device versus ambient temperature, at a fixed set point temperature.
Figure 3:
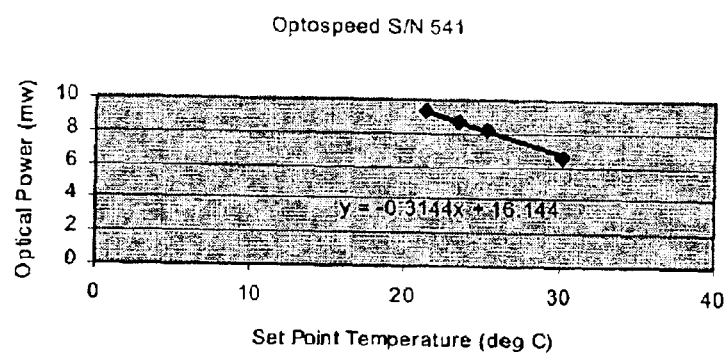
FIG. 3 shows the optical power measured from a prior art SLD device versus thermistor set point temperature, at a fixed ambient temperature.

FIGS. 2 and 3 show the results of two parametric tests performed on a prior-art SLD device. FIG. 2 shows the optical power measured from the SLD device versus ambient temperature, at a fixed thermistor set point temperature. The external temperature control electronics use the thermistor signal as feedback to control the TEC, so as to maintain the fixed thermistor set point temperature. FIG. 3 shows the optical power measured from the SLD device versus the thermistor set point temperature, at a fixed ambient temperature. Although FIGS. 2 and 3 represent the characteristics of one specific SLD device, the general results are representative of many SLD devices from various manufacturers.

FIG. 3 shows that the optical power output of the SLD chip is inversely proportional to the temperature of the SLD chip, i.e., the power output decreases linearly as a function of increasing SLD chip temperature. FIG. 2 shows that the optical power output of the SLD chip is directly proportional to the ambient temperature. Considering the results of FIG. 3, FIG. 2 implies that the temperature of the SLD chip decreases as the ambient temperature increases. However, since the conditions in FIG. 2 include a fixed thermistor set point temperature, the actual temperature of the SLD chip can decrease only if there is a temperature gradient from the SLD chip to the thermistor. This phenomenon can not be the result of heat flow/leakage into the SLD device package, because during the cooling mode, such heat flow would tend to increase operating temperatures of the SLD chip. Local heating of the thermistor would produce additional cooling to balance the heat flow resulting in a lower operating temperature and hence an increase in optical power. But it is unlikely that local heating could result due to the small surface area of the thermistor and the low thermal resistance to the TEC surface. It is theorized that this phenomenon is a result of three effects: spatial separation between the SLD chip and the thermistor, finite in-plane conductivity of the TEC substrate and the temperature dependence of the thermoelectric materials.

The equation for thermoelectric cooling is given by:

$$Q = \alpha T I - \tfrac{1}{2} I^2 R - K \Delta T \tag{1}$$

where;
  $\alpha$ is the Seebeck Coefficient
  R is the module average electrical resistance
  K is the module average thermal conductance I is the electrical current T is the mean temperature of the TEC T is the temperature difference across the TEC Equation (1) shows that the heat load that can be pumped across a temperature difference ΔT is limited by (i) heat conduction through the TEC and (ii) the joulean heat developed because of the electrical resistance of the TEC elements. Equation (1) also shows that because the Seebeck coefficient, thermal conductance and electrical resistance are dependent upon the mean temperature, the cooling performance of the TEC is dependent upon the operating temperature.

When the SLD chip is inactive (i.e., no input power applied), the temperature difference across the TEC is a maximum for any given temperature, and the temperature across the TEC substrate surface is uniform. When the SLD chip is active (i.e., powered), the SLD chip applies a localized heat load to the TEC, and a temperature gradient develops across the spatial separation between the SLD chip and the thermistor that provides feedback control. The temperature gradient occurs because the heat source (i.e., the SLD chip) is localized and conduction across the substrate is finite, limited by the thermal conductivity of the substrate material. Further, because the TEC materials are temperature dependent, the temperature difference between the SLD and the thermistor is likewise temperature dependent.

Relationships exist between (i) the optical power of the SLD output and the SLD chip temperature, and (ii) the wavelength of the SLD output and SLD chip temperature. Testing of SLDs, exemplified by the results of FIGS. 2 and 3 were therefore used to deduce that the wavelength of the SLD output is changing approximately 2–3 ppm/° C. case temperature, depending on SLD manufacturer. These wavelength sensitivity results have been substantiated by direct measurement of the SLD wavelength using an Optical Spectrum Analyzer (OSA). This implies that measures taken to stabilize the optical power sensitivity of the SLD with respect to ambient temperature will also stabilize the wavelength sensitivity of the SLD with respect to ambient temperature.

Accordingly, the following steps provide a method of stabilizing the wavelength sensitivity of an SLD device with respect to ambient temperature:

1. Empirically determine the optical power sensitivity of the SLD device with respect to the device case (i.e., package) temperature ($dP_o/dT_c$), similar to what is shown in FIG. 2;
2. Calculate a thermistor set point resistance change versus case temperature ($dR/dT_c$), corresponding to the $dP_o/dT_c$; and,
3. Insert compensation into the temperature control feedback loop consisting of the TEC, the thermistor and the external temperature control electronics, where the compensation corresponds to an amount equal and opposite to $dR/dT_c$.

In this description, the "ambient" temperature is determined by sensing the temperature of the device case. It should be noted that although the case temperature and the ambient temperature are related, in some cases there may be some disparity. The disparity is typically negligible. In some embodiments, however, the method may include sensing true ambient temperature. The particular SLD characterized by FIGS. 2 and 3 may be used in the following example to illustrate this method. FIG. 2 shows that the $dP_o/dT_c$ for this particular SLD is approximately 0.0023 mW/° C. (case). FIG. 3 shows that the optical power sensitivity of the SLD device with respect to the thermistor set point temperature $dP_o/dT_s$ is approximately –0.314 mW/° C. (set point). Dividing $dP_o/dT_c$ by $dP_o/dT_s$ gives the incremental change in the set point temperature with respect to the change in the case temperature, $dT_s/dT_c$, of –0.0073. From data sheets associated with the thermistor, the change in thermistor resistance with respect to set point temperature, $dR/dT_s$ is given by 500 Ω/° C. Multiplying $dR/dT_s$ by $dT_s/dT_c$ gives:

$$dR/dT_c = (500\ \Omega/°\ C.)(-0.0073) = -3.65\ \Omega/°\ C.$$

The SLD represented by the data in FIGS. 2 and 3 therefore exhibits optical power sensitivity, with respect to case temperature, of approximately 0.0023 mW/° C. (case). This power sensitivity may be represented by a change in set point thermistor resistance, with respect to case temperature, of –3.65 Ω/° C. To mitigate the optical power variations (and consequently the wavelength variations) with respect to case temperature, the temperature control electronics are modified in a way that offsets the $dR/dT_c$ variation of –3.65 Ω/° C. by an amount equal and opposite, i.e., by +3.65 Ω/° C. In one embodiment of a system 100 for stabilizing an SLD device 102, shown in FIG. 4, the set point thermistor 104 located near the SLD chip 105 is electrically coupled to the temperature control electronics 106, to be used as one element in a bridge circuit 108. The output of the bridge circuit 108 provides a control signal 110 to a TEC drive circuit 112 that drives the TEC 114 to cool the SLD chip 105. The driving circuit 112 produces a compensated TEC control signal that 113 that defines the cooling characteristics of the TEC 114. The set point thermistor 104, the temperature control electronics 106 and the TEC 114 thus form a temperature control feedback loop. In this embodiment, a case sensing thermistor 116 is attached to the case 118 of the SLD device 102. The case sensing thermistor 116 is electrically coupled to the bridge circuit 108 in a manner that offsets the variations (with respect to case temperature) of the set point thermistor 104. In one embodiment, the second thermistor 116 is combined with additional support circuitry (not shown) so that the resulting combination will exhibit the desired resistance profile as a function of case temperature, i.e., a resistance profile that offsets the variations (with respect to case temperature) of the set point thermistor 104.

In other embodiments, the change in set point thermistor resistance, with respect to case temperature (i.e., $dR/dT_c$) may be offset by other techniques known in the art. For example, the temperature control electronics may include an applications specific integrated circuit (ASIC) that produces a compensated TEC control signal as a function of the set point temperature and the case temperature. In other embodiments, the temperature control electronics may include a processor executing code (i.e., software, firmware, etc) that algorithmically produces a compensated TEC control signal as a function of the set point temperature and the case temperature. Such digitally based systems utilize A/D converters and D/A converters known in the art to provide the necessary interfaces between analog and digital components. In other embodiments, the temperature control electronics may include a look-up table (LUT) specifically formulated to satisfy the specific characteristics of a particular SLD device. Although the embodiments generally described herein utilize thermistors for sensing set point temperature and case temperatures, other temperature sensing devices may also be used, such as resistance temperature detectors (RTDS) other than thermistors, thermocouples, infrared temperature detectors, and other temperature sensing devices known in the art. In such embodiments, the temperature sensing device provides a temperature sensing signal, not necessarily a resistance, to provide an indication of the associated temperature. In other embodiments, the temperature sensing device may sense true ambient temperature rather than the case temperature to provide a signal to offset the temperature set point within the SLD device.

Figure 4:
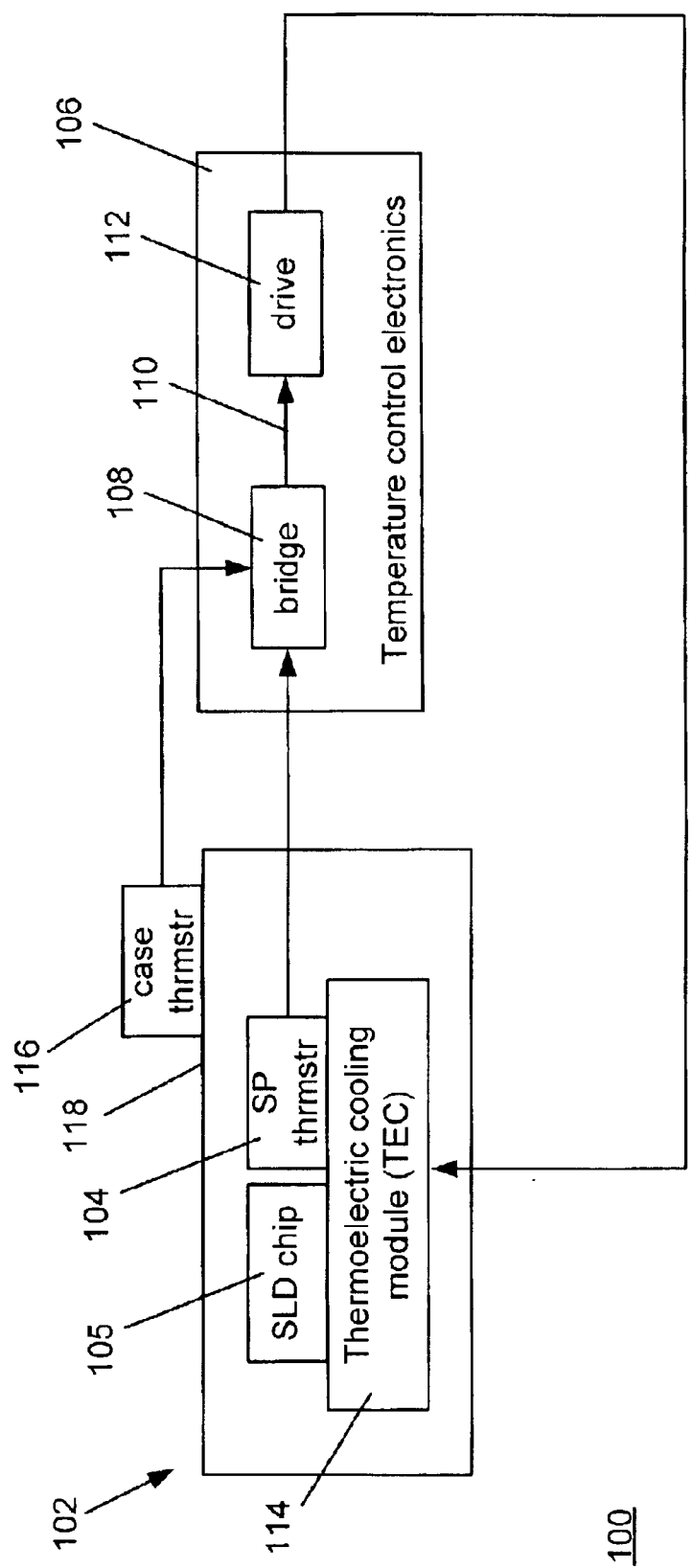
FIG. 4 a block diagram of one embodiment of a system for stabilizing an SLD device.
Figure 5:
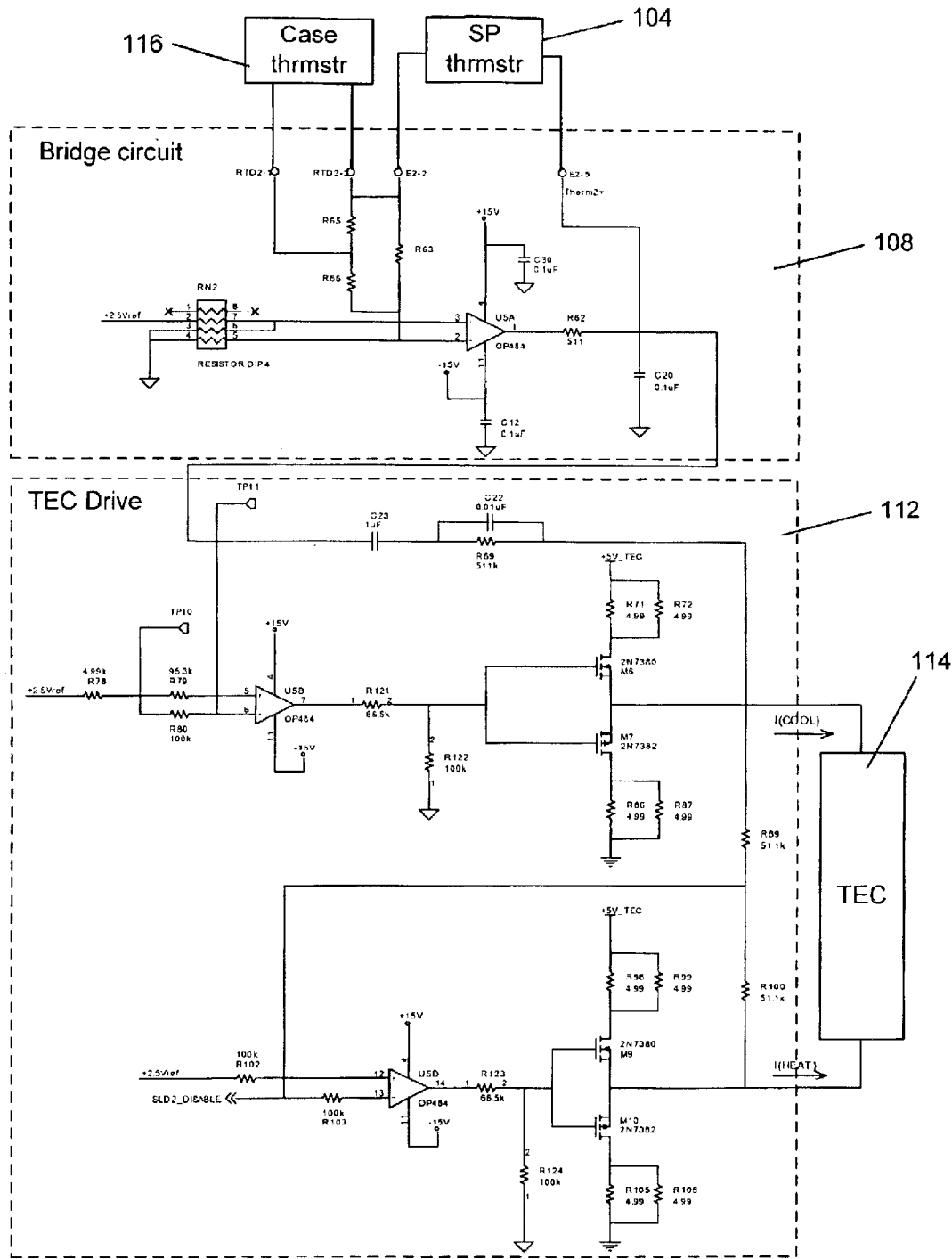
FIG. 5 shows details of one embodiment of the temperature control electronics of FIG. 4.

FIG. 5 shows details of one embodiment of the temperature control electronics 106 of FIG. 4. The bridge circuit 108 is shown electrically coupled to the case thermistor 116 and the set point thermistor 104. The bridge circuit 108 provides a control signal 110 to the TEC drive circuit 112, which drives the TEC 114 as described herein.

Figure 6:
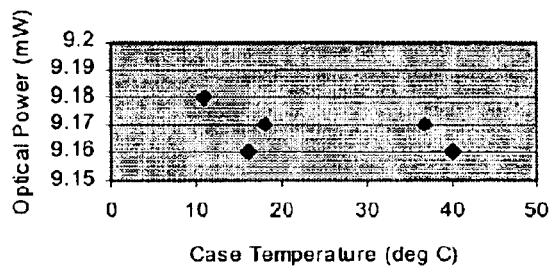
FIG. 6 shows the optical power measured from an SLD device versus ambient temperature, using the embodiment shown in FIG. 4; and, FIG. 7 shows data similar to that in FIG. 6, taken on a different date.
Figure 7:
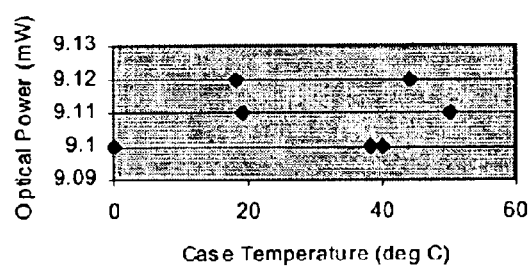

FIGS. 6 and 7 illustrate optical power data taken on two different dates, corresponding to the SLD device associated with FIGS. 2 and 3, using the case temperature feedback embodiment described in FIG. 4. The data of FIGS. 6 and 7 indicates that this embodiment provides about a ten-fold improvement in temperature and hence scale factor stability.

Based upon the concepts and embodiments described herein, and assuming a reasonable level of process control by the SLD manufacturer, a single embodiment encompassing a particular compensation scheme would be applicable to all devices from a single manufacturer to satisfy a moderate range of scale factor stability requirements. In order to satisfy unusually stringent scale factor stability requirements, tailoring the compensation scheme for each individual SLD device would provide a higher degree of scale factor stability.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A method of stabilizing an optical power output of an SLD device with respect to ambient temperature, the SLD device including (i) a thermoelectric cooling module (TEC) for cooling an SLD chip, and (ii) a temperature sensor for providing a set point signal corresponding to a set point temperature, wherein the TEC and the temperature sensor, together with a temperature control electronics, from a temperature control feedback loop for maintaining the set point temperature within a predetermined temperature range, comprising:

determining an incremental change of the optical power output as a function of ambient temperature, wherein the optical power output of the SLD device is proportional to ambient temperature;

determining a variation of the set point signal as a function of ambient temperature, wherein the variation of the set point signal corresponds to the variation of the optical power output; and modifying the temperature control feedback loop so as to include the determined incremental change of the optical power output as a function of ambient temperature thereby stabilizing the variation of the optical power output as a function of ambient temperature.

2. A method according to claim 1, further including determining a variation of a thermistor set point resistance, wherein the temperature sensor includes a thermistor and the set point signal includes a set point resistance.

3. A method according to claim 1, further including sensing a case temperature of a case enclosing the SLD device, and using the case temperature as ambient temperature to modify the temperature control feedback loop so as to offset the variation of the set point signal, thereby stabilizing the variation of the optical power output and the wavelength output as a function of ambient temperature.

4. A method according to claim 1, further including determining ambient temperature by sensing a case temperature of a case enclosing the SLD device.

5. A method according to claim 1, further including modifying the temperature control feedback loop with a processor executing that algorithmically produces a compensated TEC control signal as a function of the set point signal and the ambient temperature.

6. The method of claim 1, wherein the step of modifying the temperature control feedback loop so as to offset the variation of the set point signal, and thereby stabilizing the variation of the optical power output as the function of ambient temperature comprises the step of:

stabilizing the optical power output to stabilize the wavelength output of the SLD device.

7. A method according to claim 1, further including disposing a thermistor substantially adjacent to the case enclosing the SLD device, and using a resistance associated with the thermistor in the temperature control feedback loop, so as to offset the variation of the set point signal.

8. A method according to claim 7, further including attaching the thermistor to the case enclosing the SLD device.

9. A method according to claim 7, further including electrically coupling the thermistor to a bridge circuit within the temperature control electronics so as to offset the variation of the set point signal.

10. A method according to claim 9, further including combining support circuitry with the thermistor in the bridge circuit such that the thermistor combined with the support circuitry exhibits a desired resistance profile.

11. A system for stabilizing an optical power output of an SLD device with respect to ambient temperature, the SLD device including (i) a thermoelectric cooling module (TEC) for cooling an SLD chip, and (ii) a set point temperature sensor for providing a set point signal corresponding to a set point temperature, wherein the TEC and the temperature sensor, together with a temperature control electronics, form a temperature control feedback loop for maintaining the set point temperature within a predetermined temperature range, comprising:

an ambient temperature sensor disposed substantially adjacent to a case enclosing the SLD device, for providing a sensing signal representative of ambient temperature;

offsetting circuitry, associated with the temperature control feedback loop, for receiving the sensing signal representative of ambient temperature, for offsetting a variation of the set point signal as a function of an incremental change in optical power output per ambient temperature change, and for providing a compensated TEC control signal to the TEC where the compensated TEC control signal includes the variation of the set point signal, thereby stabilizing the variation of the optical power output, wherein the optical power output of the SLD device is proportional to ambient temperature.

12. A system according to claim 11, wherein the offsetting circuitry includes a processor executing code that algorithmically produces a compensated TEC control signal as a function of the set point signal and the ambient temperature.

13. A system according the claim 11, wherein the offsetting circuitry includes an ASIC device for receiving the set point signal and the sensing signal representative of ambient temperature and producing a compensated TEC control signal therefrom.

14. The system of claim 11, wherein the offsetting circuitry offsets the variation of the set point signal as the function of ambient temperature and provides the compensated TEC control signal to the TEC to stabilize the optical power output to stabilize a wavelength output of the SLD device, wherein the SLD device is part of a gyroscope.

15. The system of claim 14, wherein upon stabilization of the optical power output and the wavelength output of the SLD device, the offsetting circuitry reduces a scaling error that occurs during rotation of the gyroscope.

16. The system of claim 14, wherein the gyroscope comprises a fiber optic gyroscope.

17. A system according to claim 11, wherein the set point temperature sensor includes a thermistor, and the set point signal includes a set point resistance.

18. A system according to claim 17, wherein the offsetting circuitry includes conductors for electrically coupling the thermistor to a bridge circuit within the temperature control electronics.

19. A system according to claim 18, wherein the offsetting circuitry is further combined with support circuitry such that the thermistor combined with the offsetting circuitry and the support circuitry exhibits a desired resistance profile.

20. A system according to claim 11, wherein the ambient temperature sensor includes a thermistor for sensing a case temperature of the case enclosing the SLD device.

21. A system according to claim 20, wherein the thermistor physically contacts the case enclosing the SLD device.

22. A system according to claim 21, wherein the thermistor is attached to the case enclosing the SLD device.

23. A system for stabilizing an optical power output and a wavelength output of an SLD device with respect to ambient temperature, the SLD device including (i) a thermoelectric cooling module (TEC) for cooling an SLD chip, and (ii) a set point temperature sensor for providing a set point signal corresponding to set point temperature, wherein the TEC and the temperature sensor, together with a temperature control electronics, form a temperature control feedback loop for maintaining the set point temperature within a predetermined temperature range, comprising:

means for sensing ambient temperature disposed substantially adjacent to a case enclosing the SLD device, for providing a sensing signal representative of ambient temperature;

means for receiving the sensing signal representative of ambient temperature, for offsetting a variation of the set point signal as a function of a determined incremental change of optical power output per degree of ambient temperature change, and for modifying the temperature control feedback loop so as to include the offsetting variation of the set point signal, thereby stabilizing the variation of the optical power output, wherein the optical power output of the SLD device is proportional to ambient temperature.

24. A method of stabilizing an optical power output of an SLD device with respect to ambient temperature, the SLD device including (i) a thermoelectric cooling module (TEC) for cooling an SLD chip, and (ii) a temperature sensor for providing a set point signal corresponding to a set point temperature, wherein the TEC and the temperature sensor, together with a temperature control electronics, form a temperature control feedback loop for maintaining the set point temperature within a predetermined temperature range, comprising:

determining an incremental change of the optical power output of the SLD device with respect to ambient temperature, wherein the optical power output of the SLD device is proportional to ambient temperature;

determining a variation of a thermistor set point resistance, wherein the temperature sensor includes a thermistor and the set point signal includes a set point resistance; and sensing a case temperature of a case enclosing the SLD device via a thermistor disposed substantially adjacent to the case, and using the case temperature as ambient temperature to modify the temperature control feedback loop so as to offset the variation of the set point resistance by an amount corresponding to the determined incremental change, thereby stabilizing the variation of the optical power output as a function of ambient temperature.

25. A system for stabilizing an optical power output and a wavelength output of an SLD device with respect to ambient temperature, the SLD device including (i) a thermoelectric cooling module (TEC) for cooling an SLD chip, and (ii) a set point temperature sensor for providing a set point signal corresponding to a set point temperature, wherein the TEC and the temperature sensor, together with a temperature control electronics, form a temperature control feedback loop for maintaining the set point temperature within a predetermined temperature range, comprising:

a thermistor attached to a case enclosing the SLD device, for providing a sensing resistance representative of ambient temperature;

offsetting circuitry associated with the temperature control feedback loop, for receiving the sensing signal representative of ambient temperature, for offsetting a variation of the set point signal as a function of an incremental change in optical power output per ambient temperature change, for providing a compensated TEC control signal to the TEC where the compensated TEC control signal includes the variation of the set point signal, thereby stabilizing the variation of the optical power output, wherein the optical power output of the SLD device is proportional to ambient temperature;

wherein the offsetting circuitry includes conductors for electrically coupling the thermistor to a bridge circuit within the temperature control electronics, and includes support circuitry such that the thermistor combined with the offsetting circuitry and the support circuitry exhibits a resistance profile that includes a change in resistance corresponding to the incremental change in optical power output per ambient temperature change.

* * * * *